US010467351B2

(12) United States Patent
Christensen et al.

(10) Patent No.: US 10,467,351 B2
(45) Date of Patent: Nov. 5, 2019

(54) SYSTEMS, METHODS AND USER INTERFACE FOR GRAPHICAL CONFIGURATION FOR FIELD IRRIGATION SYSTEMS

(71) Applicant: VALMONT INDUSTRIES, INC., Omaha, NE (US)

(72) Inventors: Dale A. Christensen, Arlington, NE (US); Bruce Kreikemeier, West Point, NE (US); Kevin K. Fischman, Elkhorn, NE (US); Todd Zessin, Elkhorn, NE (US)

(73) Assignee: VALMONT INDUSTRIES, INC., Omaha, NE (US)

( * ) Notice: Subject to any disclaimer, the term of this patent is extended or adjusted under 35 U.S.C. 154(b) by 700 days.

(21) Appl. No.: 15/065,821

(22) Filed: Mar. 9, 2016

(65) Prior Publication Data
US 2016/0267203 A1 Sep. 15, 2016

Related U.S. Application Data

(60) Provisional application No. 62/132,820, filed on Mar. 13, 2015.

(51) Int. Cl.
| *G06F 17/50* | (2006.01) |
| *G06F 3/0484* | (2013.01) |
| *G06Q 50/02* | (2012.01) |
| *G06Q 10/06* | (2012.01) |

(52) U.S. Cl.
CPC ........ *G06F 17/5004* (2013.01); *G06F 3/0484* (2013.01); *G06Q 10/06* (2013.01); *G06Q 50/02* (2013.01)

(58) Field of Classification Search
None
See application file for complete search history.

(56) References Cited

U.S. PATENT DOCUMENTS

| 5,828,376 | A | * | 10/1998 | Solimene | G06F 3/0481 715/821 |
|---|---|---|---|---|---|
| 5,850,560 | A | * | 12/1998 | Kang | G06F 1/32 713/324 |
| 6,236,907 | B1 | * | 5/2001 | Hauwiller | A01B 79/005 111/200 |
| 2010/0032493 | A1 | * | 2/2010 | Abts | A01G 25/092 239/11 |
| 2010/0032495 | A1 | * | 2/2010 | Abts | A01G 25/167 239/69 |
| 2012/0095651 | A1 | * | 4/2012 | Anderson | G05D 1/0274 701/50 |
| 2012/0237083 | A1 | * | 9/2012 | Lange | G06K 9/00805 382/103 |
| 2013/0134240 | A1 | * | 5/2013 | Malsam | A01G 25/09 239/728 |
| 2015/0370935 | A1 | * | 12/2015 | Starr | G06Q 50/02 703/11 |

(Continued)

*Primary Examiner* — Bijan Mapar
(74) *Attorney, Agent, or Firm* — Milligan PC LLO

(57) ABSTRACT

The present invention provides an improved system and method for designing an irrigation system for a selected field. According to a preferred embodiment, the system and method of the present invention calculates a complete bill of materials, customer pricing, design requirements and dimensions for a field irrigation system for a given irrigated field.

10 Claims, 6 Drawing Sheets

(56) References Cited

U.S. PATENT DOCUMENTS

2016/0088807 A1* 3/2016 Bermudez Rodriguez ................. A01G 25/092
  700/284
2017/0270446 A1* 9/2017 Starr ................ G06Q 10/06313
2018/0014452 A1* 1/2018 Starr ................... A01M 7/0089

* cited by examiner

SYSTEMS, METHODS AND USER INTERFACE FOR GRAPHICAL CONFIGURATION FOR FIELD IRRIGATION SYSTEMS

RELATED APPLICATIONS

The present application claims priority to U.S. Provisional Application No. 62/132,820 filed Mar. 13, 2015.

FIELD OF INVENTION

The present invention is related in general to a system and method which allows users to accurately define, measure and design an irrigation system, and, in particular, to a system and method for designing, price quoting and quickly verifying and transferring specific irrigation system design information to a given field location.

BACKGROUND OF THE INVENTION

Designing the structural components of a field irrigation system can be a time-consuming and inaccurate process. Currently, approximate field measurements are first made on-site and used by the Dealer to calculate the design and prepare a quote for the field irrigation system. In this process, the design of the irrigation system may not be adjusted and customized to the irrigated field until the components of the irrigation system have been delivered. As a result, important details regarding the irrigated field are not taken into account. Because of this, the initial parts orders and pricing are forced to be a broad estimate that is changed by later Dealer calculations and field measurements. Additionally, new field irrigation systems are commonly required to be further customized on-site which adds to significant costs and delays.

Based on the foregoing, the present invention provides an improved system and method for designing, price quoting and ordering a field irrigation system. The present invention overcomes the short coming of the prior art by accomplishing this critical objective.

SUMMARY OF THE DISCLOSURE

The present invention provides an improved system and method for accurately designing and installing an irrigation system for a selected field. According to a preferred embodiment, the system and method of the present invention may calculate a complete bill of materials, customer pricing, design requirements and overall metes and bounds for completing a field irrigation system.

According to one aspect of the present invention, the system of the present invention allows a user to determine and select the most advantageous irrigation system for a given field.

According to a further aspect of the invention, the system of the present invention preferably allows a user to design irrigation machine systems using geo-imaging services (such as Google Earth) to provide a satellite image as background for overlays of the irrigation system design. Further, a user may use computer aided design (CAD) tools to further define the dimensions of a field to be irrigated.

According to a further aspect of the present invention, a method for designing a field irrigation system is further provided which includes the steps of: configuring, designing, and selecting various field layout configurations of an irrigation system; quickly creating a plurality of field layout configurations; displaying an image of a selected field; defining the field boundaries, and locating the pivot circle, pivot point, pivot road, well location, power poles, existing bridges, and other features specific to the field; capturing inputs for parameters of the field site that influence perimeter and field boundaries, center pivot placement, start/end angles, and LRDU (last regular drive unit) circle placement; and calculating a complete bill of materials, customer pricing, design requirements and overall metes and bounds for completing a field irrigation system and irrigated acreage calculations. Other goals and advantages of the invention will be further appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

BRIEF DESCRIPTION OF THE DRAWINGS

Elements in the figures have not necessarily been drawn to scale in order to enhance their clarity and to improve the understanding of the various elements and embodiments of the invention. Furthermore, elements that are known to be common and well understood to those in the industry are not depicted in order to provide a clear view of the various embodiments of the invention. Thus, it should be understood that the drawings are generalized in form in the interest of clarity and conciseness.

DETAILED DESCRIPTION OF THE DRAWINGS

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

For different field configurations and dimensions, different types of irrigation designs are needed. Accordingly, during the design process, different irrigation designs are preferably modeled and configured to each particular field. Depending on the shape of the field, a center pivot irrigation system, a linear movement system or a corner system may be used. Accordingly, when trying to configure the appropriate irrigation system for a given field, it is necessary to determine the essential geometric components of the field. Further, it is necessary to identify and calculate changes to the design required by features within the field such as the positions of trees, reuse pits, drainage ditches, pivot wheel track bridges, buildings, utility poles, buildings, etc.

Based on the determined shape and features of a given field, an appropriate irrigation system needs to be created and then tailored to the field. In this process, the cost of each system needs to be weighed against the estimated irrigation benefits for each design. Further, the coverage and irrigation specifications of the modeled irrigation system must be taken into account.

To allow for the efficient and accurate design of an irrigation system, the present invention provides a system, method and interface for users to correctly model and select an irrigation system for a given plot of land, transfer that information to the Field Layout Tool and accurately locate key design information within the field before the machine arrives on location. According to a preferred embodiment, the system of the present invention may include desktop and web components which will be discussed in further detail below.

Figure 1:
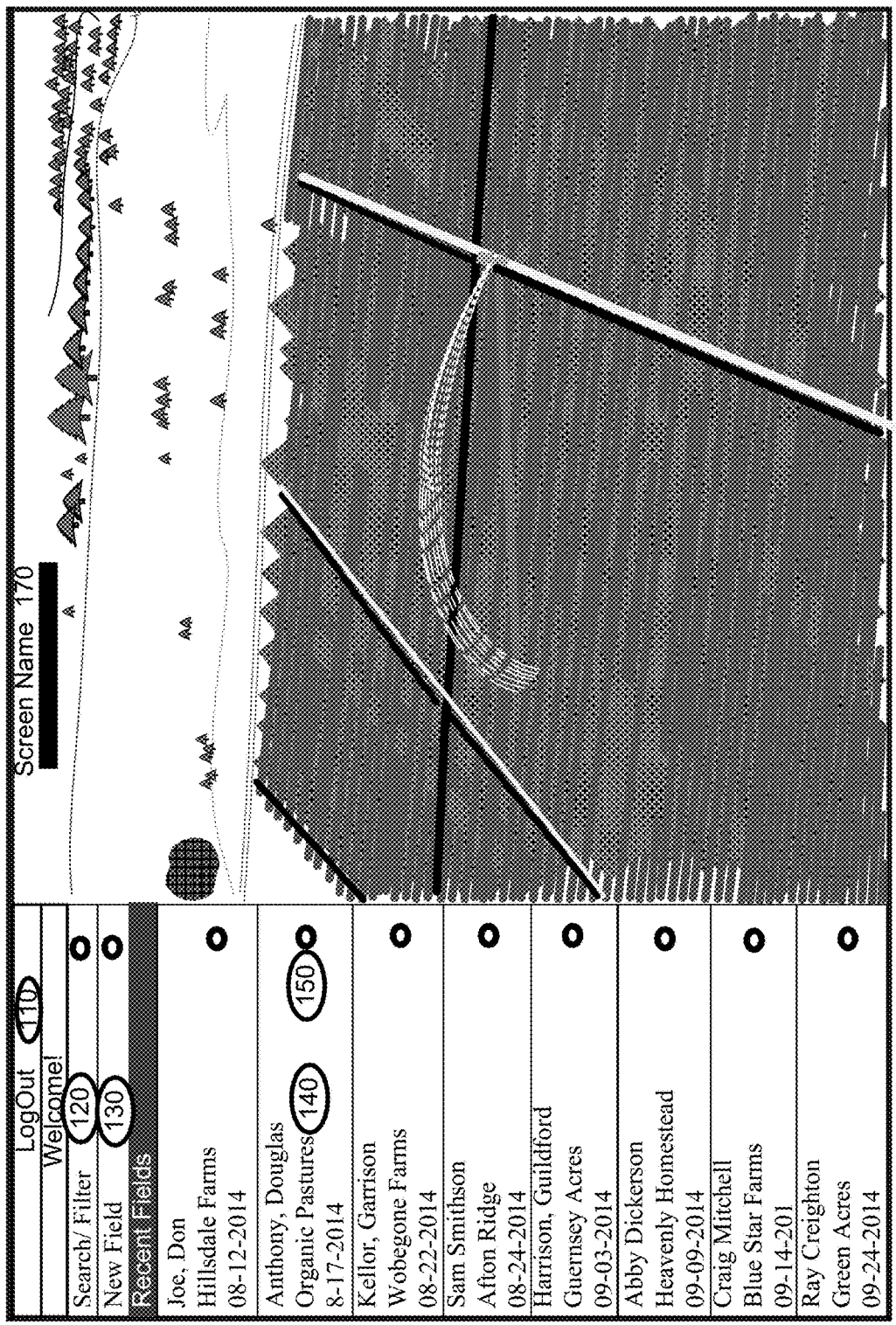
FIG. 1 illustrates a graphical representation of a tool screen for selecting a new field link.

Referring to FIG. 1, according to a first aspect of the present invention, a graphical representation of a field layout may be provided to assist a user with identifying an appropriate irrigation system for a selected field. As a first step, the user of the system may select a new field 130. Preferably, if the user is returning to the program, then the user has the option of selecting from a list of recently viewed fields 140. Further, the user may have the option of searching 120 for stored fields.

Figure 2:
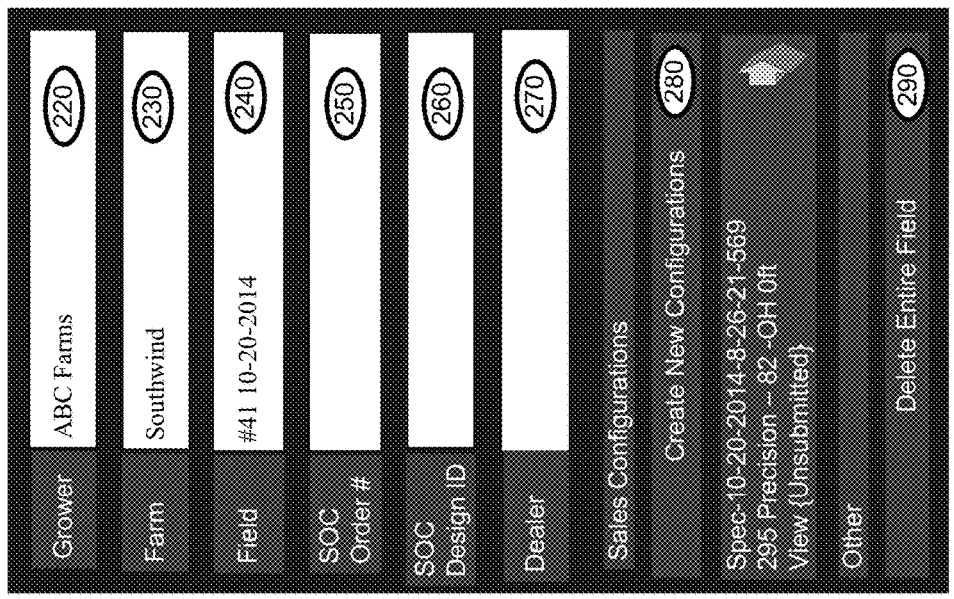
FIG. 2 illustrates a graphical representation of a tool screen for inputting identifying information for an order.

With reference now to FIG. 2, a graphical representation of a screen tool for inputting identifying information for a given field in accordance with further aspects of the invention will now be discussed. As shown in FIG. 2, the user may be prompted to enter identifying information for a given field such as a grower's name 220, a farm's name 230, a field number 240, an order number 250 or the like. Once the correct field has been identified and named, the user may begin designing a new irrigation system configuration 280 for the selected field.

Figure 3:
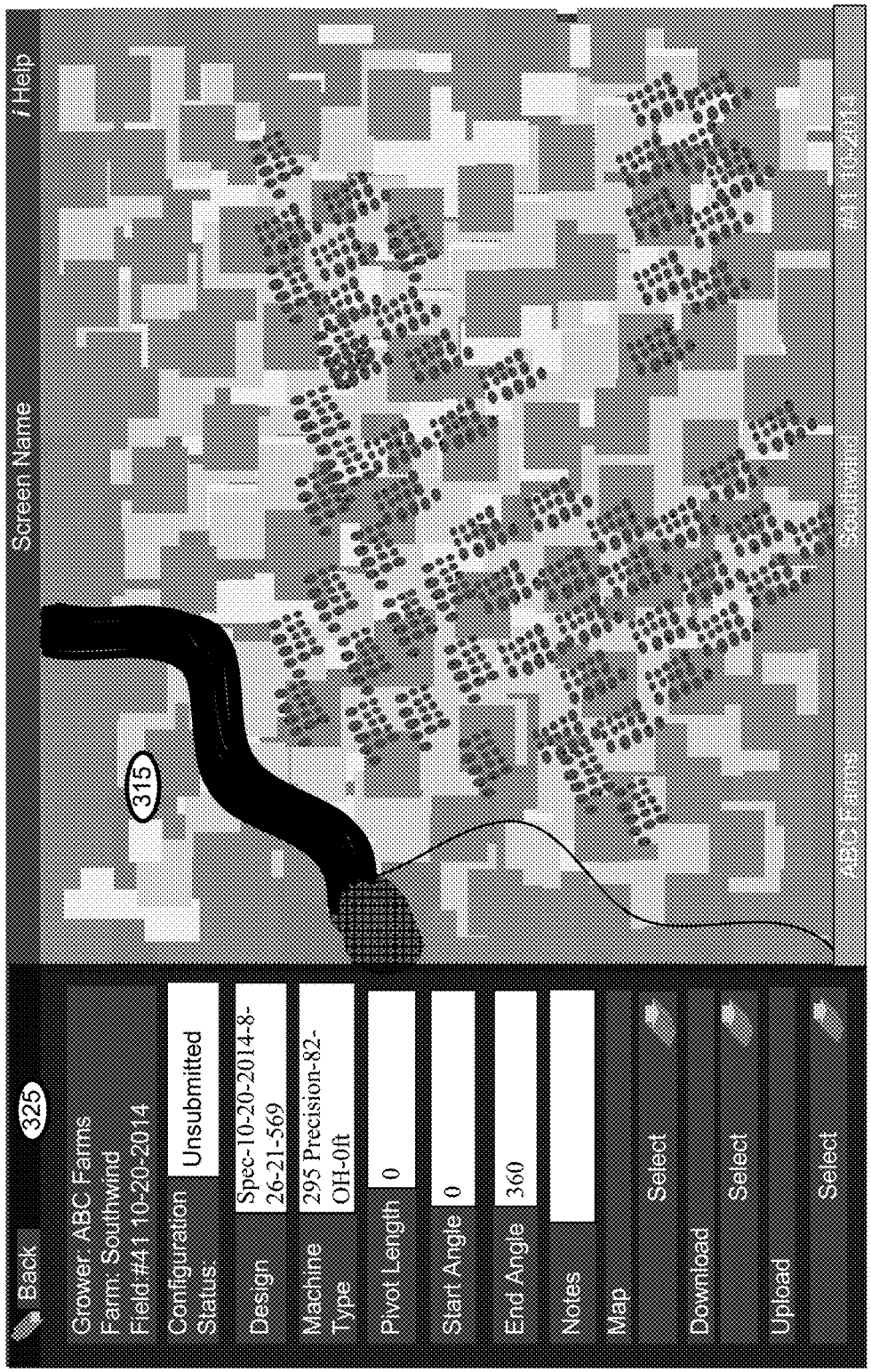
FIG. 3 illustrates a graphical representation of a tool screen of an active map application.

With reference now to FIG. 3, a graphical representation of a tool screen incorporating an active map/geo-imaging application will now be discussed. As shown in FIG. 3, once a user identifies a field of interest, the system preferably displays an image 315 of the identified field on the screen. According to a preferred embodiment, the image 315 is preferably a satellite image provided by a geo-imaging service such as Google Maps or the like. Preferably, the image may be located using GPS data, the street address of the property, latitude/longitude coordinates or other identifying information. Further, once the image is located, the user may preferably use a zoom feature to move, scale and size the image to select the target field.

With the display of the field image selected, the user may enter the machine operating information 325 including specifications for the machine type, pivot length, start and end angles. According to one preferred embodiment of the present invention, the machine operating information 325 may be entered or changed at any time during the design process using a series of drop down menus providing lists of values and parameters. This aspect of the present invention allows the user to explore different combinations of machine types, pivot lengths, and start/end angles.

Figure 4:
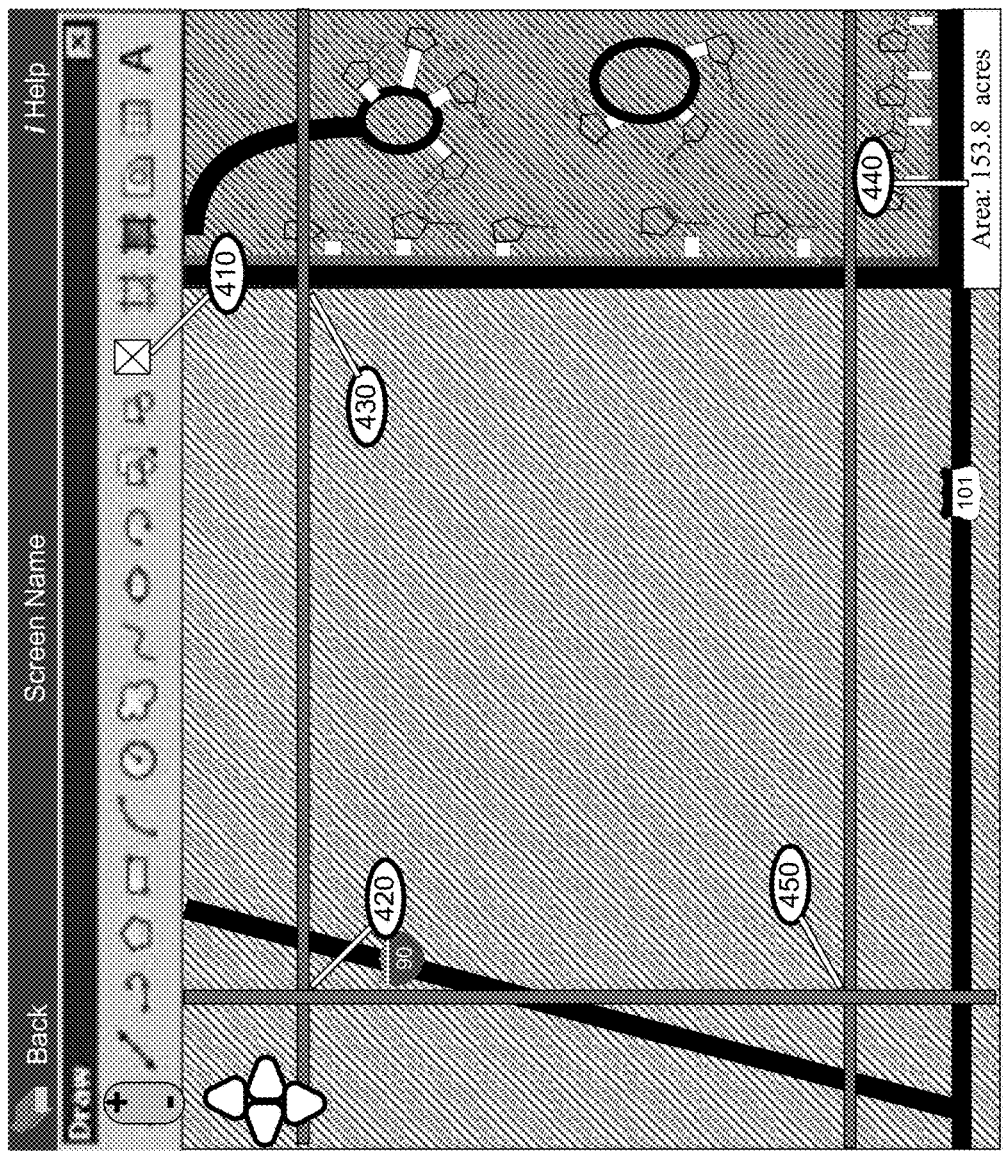
FIG. 4 illustrates a graphical representation of a tool screen for defining field boundaries.

With reference now to FIG. 4, a graphical representation of a tool screen for defining the field boundaries according to a further aspect of the present invention will now be discussed. As shown, once a user has located the correct field, the field boundaries may be defined. According to a preferred embodiment, a polygon tool or the like may be used to establish vertices for the straight line perimeter and irrigated field boundary of the field. In the example shown in FIG. 4, field boundaries are entered by using a polygon drawing tool 410. Using the drawing tool 410, the user may place a cursor at a first corner 420 of a field boundary and move to a second corner 430 in one direction around the field, either clockwise or counterclockwise. Thereafter, the user may continue to click on the various boundary points (vertices) of the field until reaching a final corner 450. According to one preferred embodiment of the present invention, an acreage calculator 440 may be provided to display the total number of acres within the irrigated field boundary.

Figure 5:
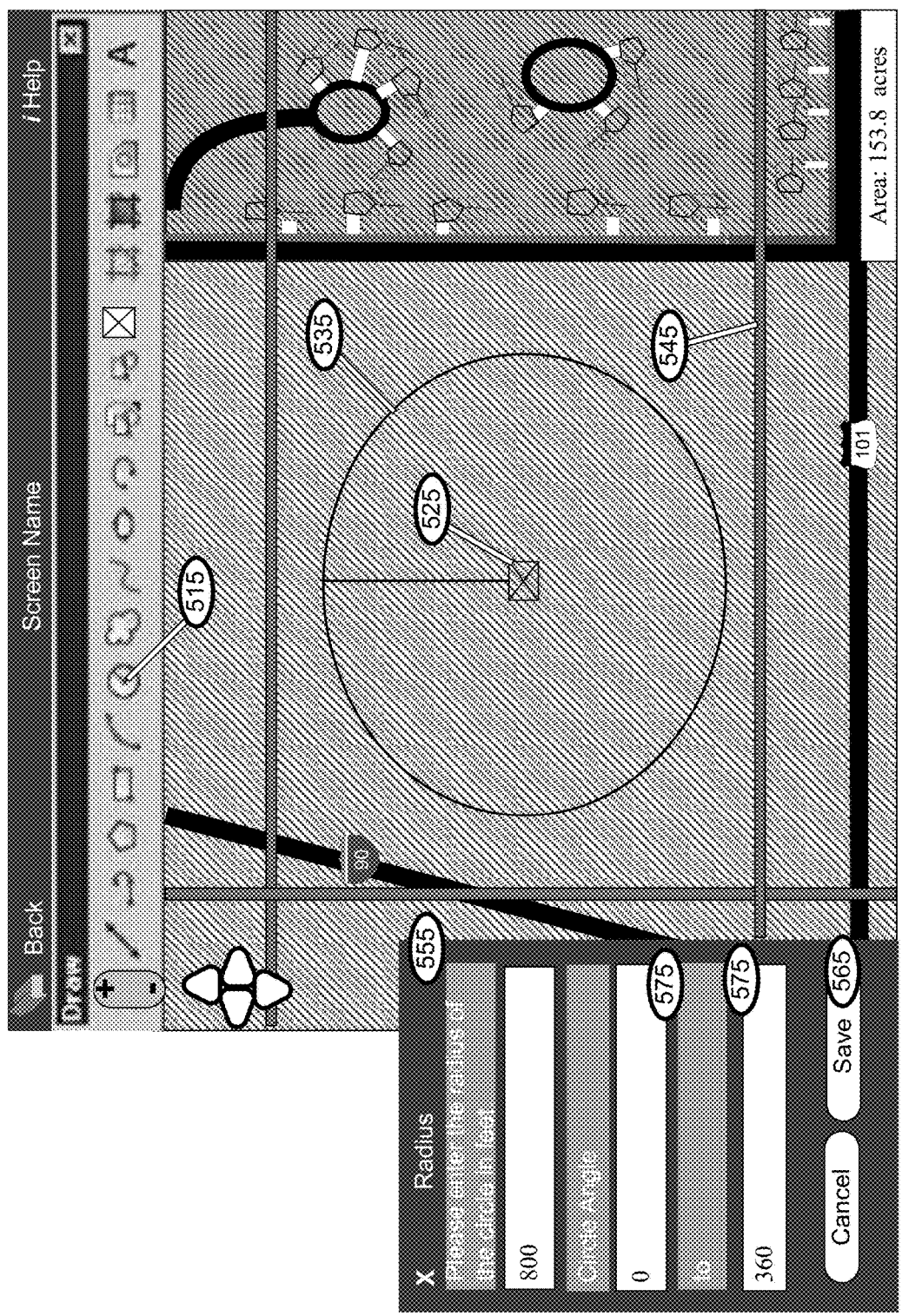
FIG. 5 illustrates a graphical representation of a tool screen for creating a full circle last regular drive unit (LRDU) path within defined field boundaries.

With reference now to FIG. 5, a graphical representation of a circle tool screen for creating the full circle last regular drive unit (LRDU) path 535 within the defined field boundaries 545 will now be discussed. According to a preferred embodiment, the user may first determine where the pivot or center point 525 should be within the previously defined field boundary. Thereafter, a radius tool 515 is preferably provided to measure and indicate the radius of the LRDU path 535 using the specifications of the irrigation system previously entered. Alternatively, the radius tool may draw and indicate the LRDU path 535 based on a radius which is provided manually. According to further aspects of the present invention, an optimum or target LRDU circle may be created based on the boundary, diameter, and other dimensions of the selected field.

After the LRDU circle path is defined, the user may add known features such as the pivot road, well locations, power poles, bridges and the like. Preferably, the user may use the Drawing tools to indicate, scale and plot each feature. As needed, the system of the present invention will preferably automatically update the LRDU path based on any added features.

Figure 6:
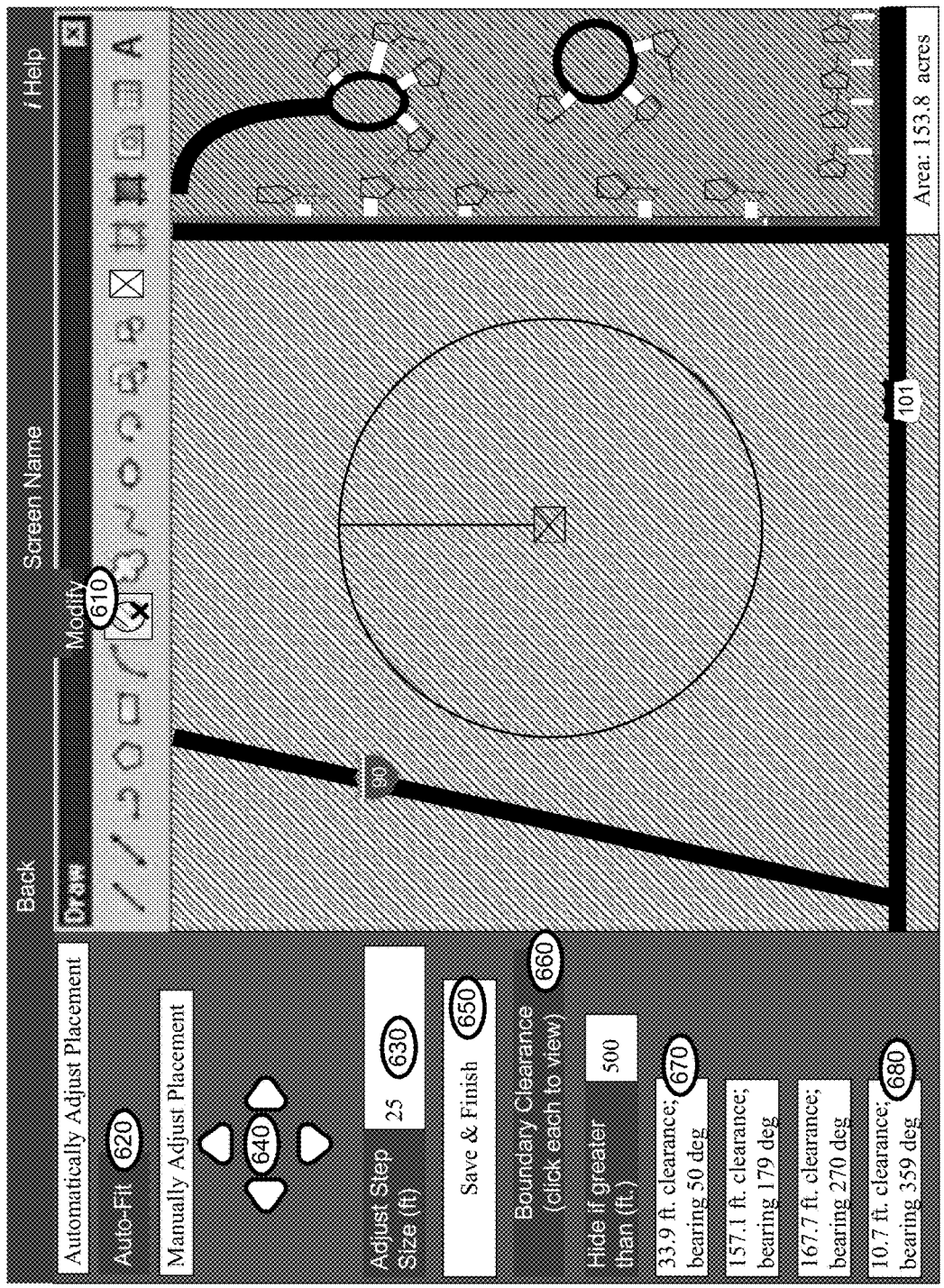
FIG. 6 illustrates a graphical representation of a tool screen for adjusting the LRDU circle placement.

With reference now to FIG. 6, a graphical representation of a tool screen for determining and adjusting the LRDU circle placement will now be discussed. According to a preferred embodiment, a user may automatically center the LRDU circle within a field boundary by using an auto-fit feature 620 of the present invention. Preferably, this feature will automatically calculate the exact center of the field area and create an auto-fitted center pivot placement. Additionally, the auto-fit feature will preferably further calculate and display the clearance distances 660 of the narrowest points between the center pivot circle perimeter and the field boundary perimeter. According to a further preferred embodiment, the user may manually adjust the center pivot placement (north/south, east/west) using a directional adjustment feature 640. According to a further preferred embodiment, the adjustment may be made with an adjustable step size. In the example shown in FIG. 6, the user may be given a menu prompt to enter the size (in feet) of the movement of the circle in the Adjust Step Size (ft.) field 630. As further shown in FIG. 6, adjustments may preferably be made to the LRDU circle placement by selecting a placement feature 610 in the Modify section of the Drawing Toolbar In the example shown in FIG. 6, the placement tool of the present invention is used by first selecting the desired circle. Once selected, the chosen circle is then highlighted and then a Placement Adjustment toolbar will be displayed. As discussed above, as the placement tool creates an auto-fitted center pivot placement, the clearance distance are preferably automatically updated and displayed. Preferably, the clearance distance displayed will be further updated as the center pivot placement is adjusted and changed. In the example shown in FIG. 6, the display is provided in the Boundary Clearances section 660. As discussed above, these clearance distances may be used to determine if adjustments to the LRDU circle are needed. As part of the placement process, the user may also indicate positions of trees, reuse pits, drainage ditches, pivot wheel track bridges, buildings, utility poles, buildings, etc.

With the dimensions determined, the user may then select various machine configurations for analysis by the system. In this process, the user may add cornering devices, additional endguns and other features as the field dimensions warrant. With this information selected, the system of the present invention may preferably calculate and display details including: pivot length, machine type, safety zones, install type (standard, inverted corner or the like), guidance tower speed, end gun reach (in feet), max ET ratio, minimum Arc Radius, full or partial circle and the start/end angles. Preferably, these calculations are performed at least in part using stored specifications of selected machines and the entered boundary information.

Additionally, the system may preferably calculate the acreage to be irrigated. Further, the system may also provide comparisons of acreage to be irrigated if obstacles were included vs. removed (e.g., irrigated acreage with trees verses if trees were removed; if reuse pit or drainages ditches were filled in). Additionally, the tool may preferably also calculate estimated field path and endgun angles (i.e., when end gun should turn on and turn off during pivot rotation through the field).

According to a further aspect of the present invention, the data collected and generated by the system may then be stored and synced to allow technicians in the field to verify and annotate the calculated dimensions and features of the selected irrigated field on a remote computer location. Updates by field technicians may be manually or automatically synced to record and transmit the data. According to a preferred embodiment, field technicians may preferably use a field layout tool to collect survey data from a device such as the Valley® GPS RTK "Rover." The details of the field layout tool preferred for use with the present invention are further discussed in detail in the Valley® "Field Layout Tool User's Guide©," the Valley® "Field Layout Tool—Reference Station Set Up©" and the Valley® "Field Layout Tool—Rover Set Up©" documents which are hereby incorporated by reference in their entirety.

According to further aspects of the present invention, if no warnings or errors appear, a printed configuration may be generated. It is entirely within the scope of the present invention to create multiple scenarios for one field in order to present and compare multiple machine configurations. Still further aspects of the present invention are detailed in the Valley® "Corner Sales Tool User's Guide©" which is hereby incorporated by reference in its entirety.

Preferably, using the GPS enabled field layout tool, a user may record location data by driving around the actual perimeter of the field to establish the perimeter. Additionally, the user can drive to the actual pivot point to establish the measured pivot point, and may also measure the end points of the pivot length. Further, GPS measurements may also be made for field items such as wheel bridges, utility poles, pump location, well location, buildings, drainage ditches, etc. As with the map generated measurements, the system of the present invention may also use the field measurements to auto-generated the guidance paths for the selected field. These may include: end tower path, corner path, end gun on/off and angles; and elevation differential between well and pumps and irrigation systems. Further, the system may also calculate power costs for pumping and/or to determine optimal pump placement.

Preferably, once all data has been received by the system (either via map or survey), a report may then be generated showing all of the boundaries, guidance paths and in-field objects, center pivot coordinates, pivot start/end angles and road angles. Further, the report may preferably include the specifications of each selected machine including: machine type, installation type, pivot length, endgun reach and the like. Further, the report preferably may further indicate the guidance path length, field acres, and a summary of the irrigated acres (i.e. total acres under machine and the like).

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

While this invention has been described and illustrated with reference to particular embodiments, it will be readily apparent to those skilled in the art that the scope of the invention is not limited to the disclosed embodiments but, on the contrary, is intended to cover numerous other modifications and equivalent arrangements which are included within the spirit and scope of the following claims.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods includes: microcontrollers with memory, embedded microprocessors, firmware, software, etc. Furthermore, aspects of the systems and methods may be embodied in microprocessors having software-based circuit emulation, discrete logic (sequential and combinatorial), custom devices, fuzzy (neutral network) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structure), mixed analog and digital, etc.

It should be noted that the various functions or processors disclosed herein may be described as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical or wired signaling media or any combination thereof. Examples of transfers of such formatted data and/or instructions by carrier waves include, but are not limited to, transfers (uploads, downloads, email, etc.) over the Internet and/or other computer networks via one or more data transfer protocols (e.g., HTTP, FTP, SMTP, etc.). When received within a computer system via one or more computer-readable media, such data and/or instruction-based expressions of components and/or processes under the systems and methods may be processed by a processing entity (e.g., one or more processors) within the computer system in conjunction with execution of one or more other computer programs.

Unless specifically stated otherwise, as apparent from the following discussions, it is appreciated that throughout the specification, discussions utilizing terms such as "processing," "computing," "calculating," "determining," or the like, may refer in whole or in part to the action and/or processes of a processor, computer or computing system, or similar electronic computing devices, that manipulate and/or transform data represented as physical, such as electronic, quantities within the system's registers and/or memories into other data similarly represented as physical quantities within the system's memories, registers or other such information storage, transmission or display devices. It will also be appreciated by persons skilled in the art that the term "users" referred to herein can be individuals as well as corporations and other legal entities. Furthermore, the processed presented herein are not inherently related to any particular computer, processing device, article or other apparatus. An example of a structure for a variety of these systems will appear from the description below. In addition, embodiments of the invention are not described with reference to any particular processor, programming language, machine code, etc. It will be appreciated that a variety of programming languages, machine codes, etc. may be used to implement the teachings of the invention as described herein.

Unless the context clearly requires otherwise, throughout the description and the claims, the words 'comprise,' 'comprising,' and the like are to be construed in an inclusive sense as opposed to an exclusive or exhaustive sense, that is to say, in a sense of 'including, but not limited to.' Words using the singular or plural number also include the plural or singular number respectively. Additionally, the words, 'herein,' 'hereinabove,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combinations of the items in the list.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the system and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

While certain aspects of the systems and methods are presented below in certain claim forms, the inventor contemplates the various aspects of the systems and methods in any number of claim forms. Accordingly, the inventor reserves the right to add additional claims after filing the application to pursue such additional claim forms for other aspects of the systems and methods.

What is claimed is:

1. A method of configuring, designing, and selecting field layout configurations of an irrigation system for irrigating a given field, the method comprising:

providing a graphical user interface comprising a user-interactive field screen for displaying a selected field and defining one or more field boundaries;

receiving GPS data with a GPS receiver; wherein the GPS receiver receives field boundary data indicating the position of the one or more field boundaries;

accessing and downloading satellite imagery data;

displaying a representation of the selected field; wherein the displayed representation utilizes satellite imagery data and GPS data for the selected field;

storing machine data information for a plurality of irrigation machines; wherein the machine data information comprises information including machine type, pivot length, and start/end angles for a plurality of irrigation machines; wherein the machine data information is selected and updated via one or more drop down menus; wherein the machine data information includes data for a plurality of optional machine configurations including cornering devices, swing arms and endguns;

converting field boundary data to a plurality of vertices defining a field boundary of the selected field;

calculating and displaying the acreage within the defined field boundary;

creating a composite overlay display, wherein the composite overlay display incorporates satellite imagery data, GPS data, and field boundary data;

receiving identification data for a center point of an area to be irrigated;

calculating and providing data to display a Last Regular Drive Unit (LRDU) path for the selected field based on selected machine data information;

calculating the LRDU path at least in part based on the field boundaries, identification data, and start/end angle data;

centering the LRDU path within the field boundary;

identifying and storing variable parameters of the selected field; wherein the variable parameters comprise location data for positions of obstacles; wherein the location data includes location data for trees, reuse pits, drainage ditches, pivot wheel tracks, utility poles, buildings, wells, power poles, and bridges;

recalculating and updating the LRDU path and clearance distances based on at least one variable parameter of the field;

calculating and displaying a comparison of acreage to be irrigated based on the presence and removal of at least one obstacle;

calculating and displaying parameters of an updated system design based on received machine data information, identification data, and variable parameters of the selected field; wherein the calculated parameters comprise pivot length, machine type, safety zones, guidance tower speed, end gun reach, minimum Arc Radius, and start/end angles; and calculating a bill of materials, customer pricing, design requirements, irrigated acres based on received machine data information, identification data, and variable parameters of the selected field.

2. The method of claim 1, wherein the field boundary data is converted to the plurality of vertices with polygon tool calculations.

3. The method of claim 2, wherein the method further comprises calculating and displaying a plurality of clearance distances between the LRDU path and the field boundary perimeter.

4. The method of claim 3, wherein the method further comprises calculating a field path and endgun angles during a calculated pivot rotation through the field.

5. A system for creating field layout configurations of an irrigation system for irrigating a selected field, wherein the system comprises:

a graphical user interface, wherein the graphical user interface comprises a user-interactive field screen for displaying a field location and defining field boundaries;

an imagery processor, wherein the imagery processor is configured to access and download satellite imagery data for the selected field;

a GPS receiver, wherein the GPS receiver is configured to receive data indicating the position of the one or more field boundaries;

a unified machine data storage module, wherein the unified machine data storage module is configured to store machine data information for a plurality of irrigation machines; wherein the machine data information comprises the machine type, pivot length, and start/end angles for a plurality of irrigation machines; wherein the machine data information further comprises data for a plurality of optional machine configurations; wherein the optional machine configurations comprise cornering devices, swing arms and endguns;

a field boundary module, wherein the field boundary module comprises a polygon tool for identification and entry of a plurality of vertices defining a field boundary of the field; wherein the field boundary module further comprises an acreage calculator module which is configured to calculate and display the acreage within a defined field boundary;

an LRDU data receiver, wherein the LRDU data receiver is configured to receive identification points for a center point of an area to be irrigated;

a radius calculation module; wherein the radius calculation module is configured to calculate and provide data to display a LRDU path for a selected field based on selected machine data information;

an LRDU processor, wherein the LRDU processor is configured to calculate an LRDU path at least in part based on field boundaries, center pivot placement data, start/end angle data, and LRDU circle placement data; wherein the LRDU module is configured to automatically center the LRDU path within a field boundary;

a field data transceiver, wherein the field data transceiver is configured to receive transmitted field data;

a variable parameter module, wherein the variable parameter module is configured to identify and capture variable parameters of the field; wherein the variable parameters comprise location data for positions of obstacles; wherein the location data for the position of obstacles comprises location data comprising: trees, reuse pits, drainage ditches, pivot wheels, tracks, buildings, utility poles, buildings, wells, power poles, and bridges;

wherein the LRDU processor is further configured to recalculate and update the LRDU path and clearance distances based on at least one variable parameter of the field; wherein the variable parameter module is configured to calculate and provide a comparison of acreage to be irrigated based on at least one obstacle being removed; and a parameter calculation module, wherein the parameter calculation module is configured to calculate and display parameters of an updated system design based on data from the LRDU processor, the graphical user interface, and the unified machine data storage module; wherein the calculated parameters comprise pivot length, machine type, safety zones, guidance tower speed, end gun reach, minimum Arc Radius, and start/end angles.

6. The system of claim 5, wherein the field boundary data is converted to the plurality of vertices with polygon tool calculations.

7. The system of claim 6, wherein the system further comprises calculating and displaying a plurality of clearance distances between the LRDU path and the field boundary perimeter.

8. The system of claim 7, wherein the system further comprises calculating a field path and endgun angles during a calculated pivot rotation through the field.

9. The system of claim 8, wherein the system further comprises a system design module, wherein the system design module is configured to calculate a bill of materials, customer pricing, design requirements, irrigated acres and overall metes and bounds for completing a field irrigation system based on data from the machine data module and the parameter calculation module.

10. The system of claim 9, wherein the machine data information is selected and updated via one or more drop down menus.

* * * * *